(12) United States Patent
Niimi et al.

(10) Patent No.: US 9,911,738 B1
(45) Date of Patent: Mar. 6, 2018

(54) VERTICAL-TRANSPORT FIELD-EFFECT TRANSISTORS WITH A DAMASCENE GATE STRAP

(71) Applicant: GLOBALFOUNDRIES Inc., Grand Cayman (KY)

(72) Inventors: Hiroaki Niimi, Cohoes, NY (US); Kwan-Yong Lim, Niskayuna, NY (US); Brent A. Anderson, Jericho, VT (US); Junli Wang, Singerlands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/586,621

(22) Filed: May 4, 2017

(51) Int. Cl.
| | | |
|---|---|---|
| *H01L 27/088* | (2006.01) | |
| *H01L 27/092* | (2006.01) | |
| *H01L 29/78* | (2006.01) | |
| *H01L 29/423* | (2006.01) | |
| *H01L 21/8238* | (2006.01) | |

(52) U.S. Cl.
CPC .... *H01L 27/092* (2013.01); *H01L 21/823814* (2013.01); *H01L 21/823828* (2013.01); *H01L 21/823885* (2013.01); *H01L 29/42376* (2013.01); *H01L 29/7827* (2013.01)

(58) Field of Classification Search
CPC ............ H01L 27/0886; H01L 27/0924; H01L 29/7827; H01L 29/7831; H01L 21/823885; H01L 21/823821; H01L 21/823828
See application file for complete search history.

(56) References Cited

U.S. PATENT DOCUMENTS 9,418,994 B1 * 8/2016 Chao .................... H01L 27/0886
9,786,788 B1 * 10/2017 Anderson ......... H01L 29/78642

\* cited by examiner

*Primary Examiner* — Andrew Q Tran
(74) *Attorney, Agent, or Firm* — Thompson Hine LLP; Yuanmin Cai

(57) ABSTRACT

Methods for forming a structure that includes vertical-transport field-effect transistors and structures that include vertical-transport field-effect transistors. A first semiconductor fin is separated from a second semiconductor fin by a gap. A gate stack is conformally deposited that extends across the first semiconductor fin, the second semiconductor fin, and the gap. A section of the gate stack is located in the gap. A gate strap layer is formed in the gap on the section of the gate stack. The gate stack is patterned to form a first gate electrode associated with the first semiconductor fin and a second gate electrode associated with the second semiconductor fin. The gate strap layer masks the section of the gate stack when the gate stack is patterned. The first gate electrode is connected with the second gate electrode by the gate strap layer and the section of the gate stack.

20 Claims, 5 Drawing Sheets

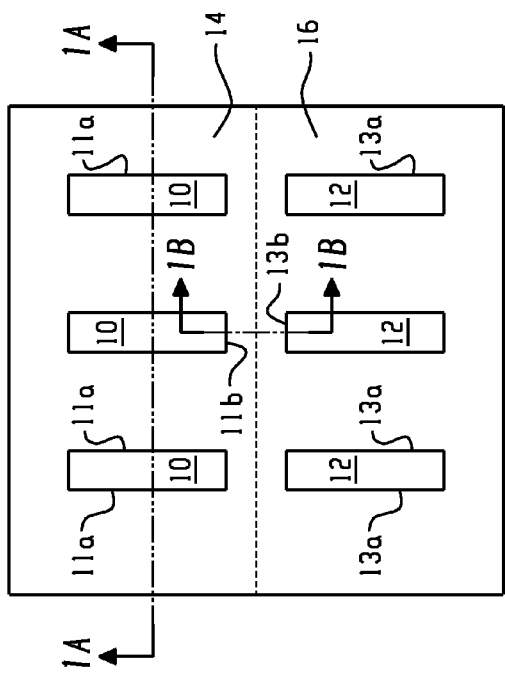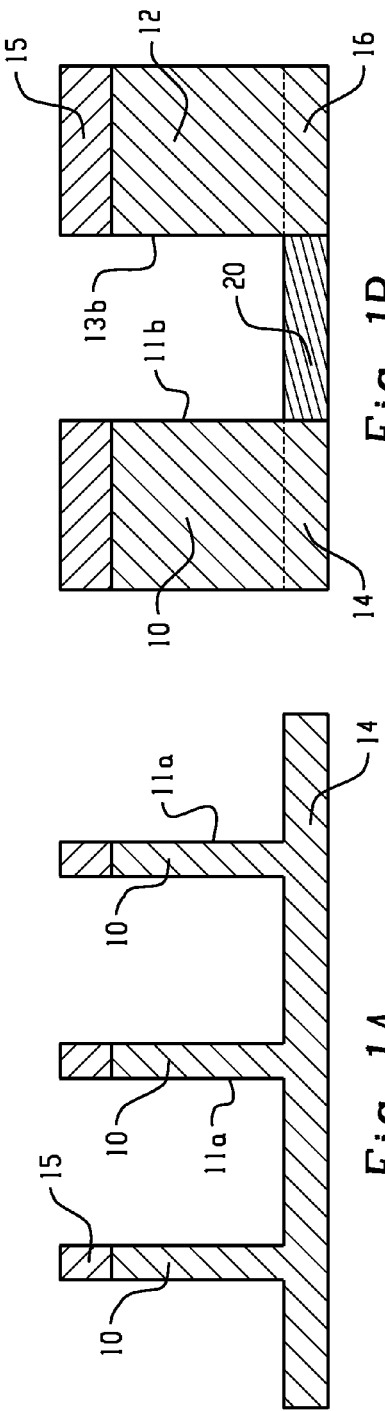

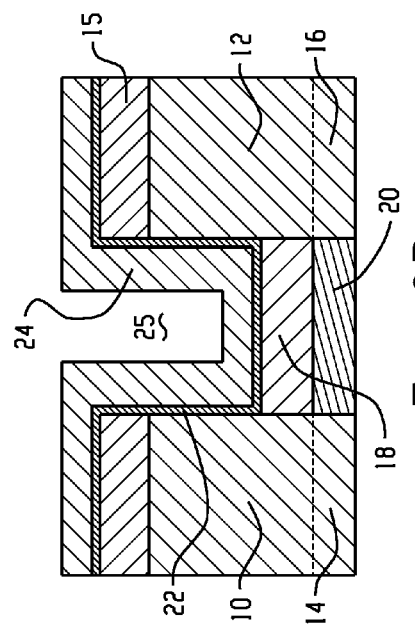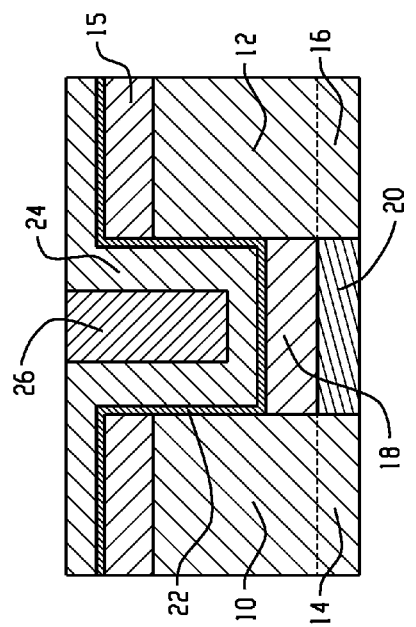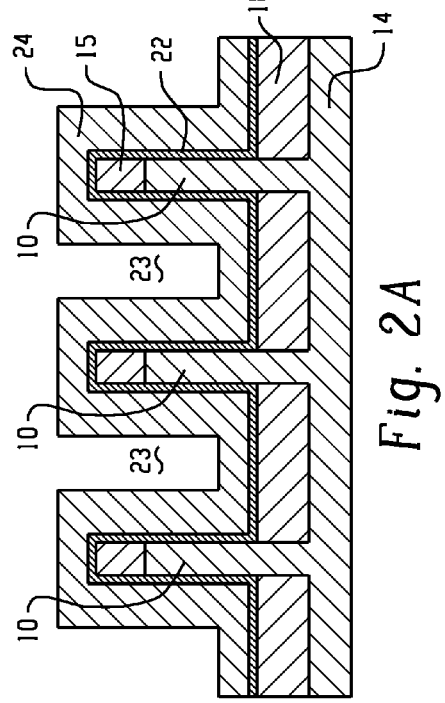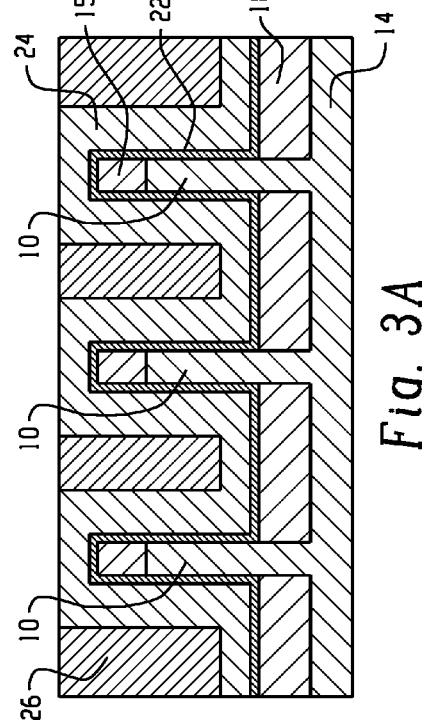

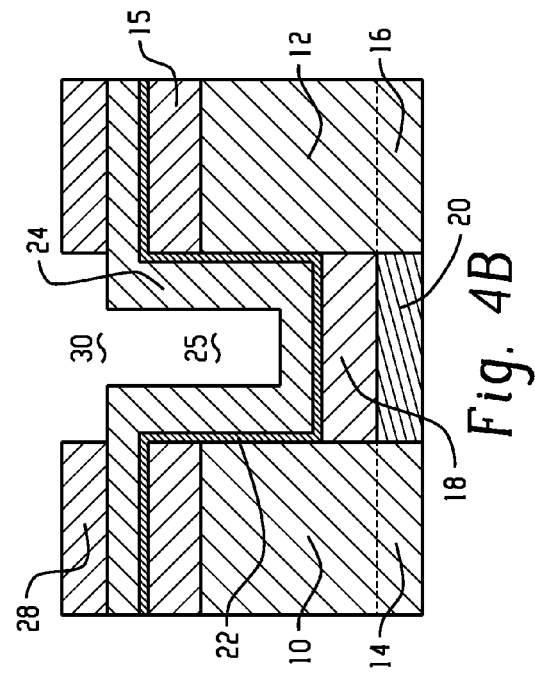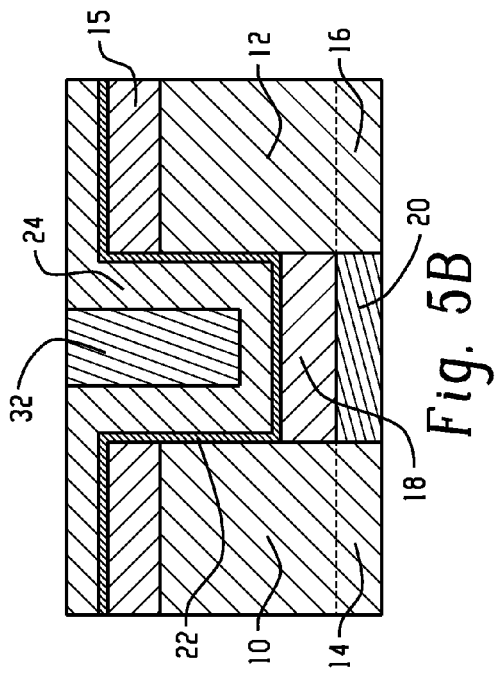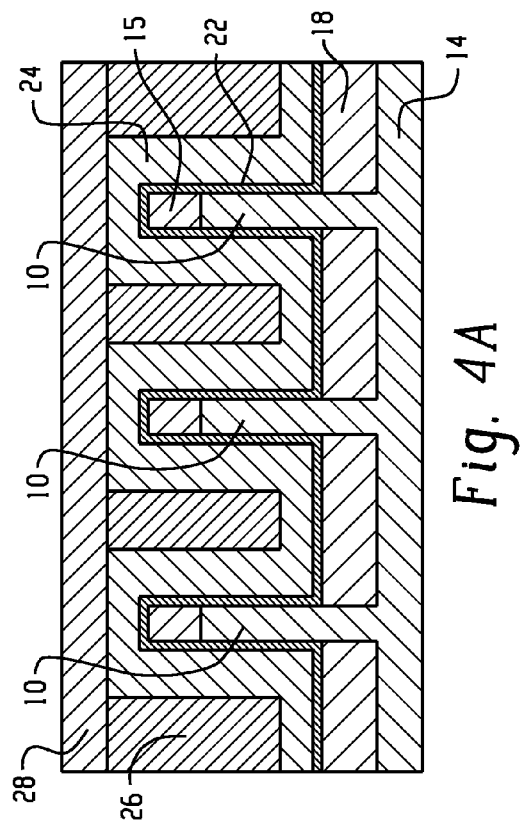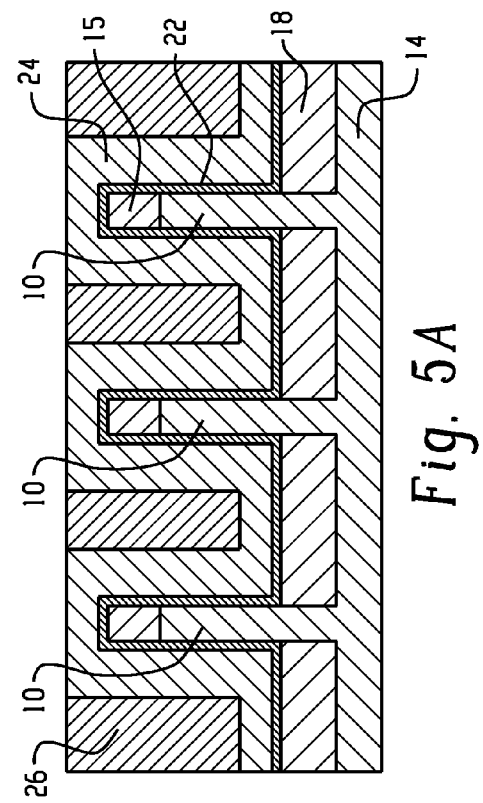
Fig. 4A    Fig. 4B
Fig. 5A    Fig. 5B

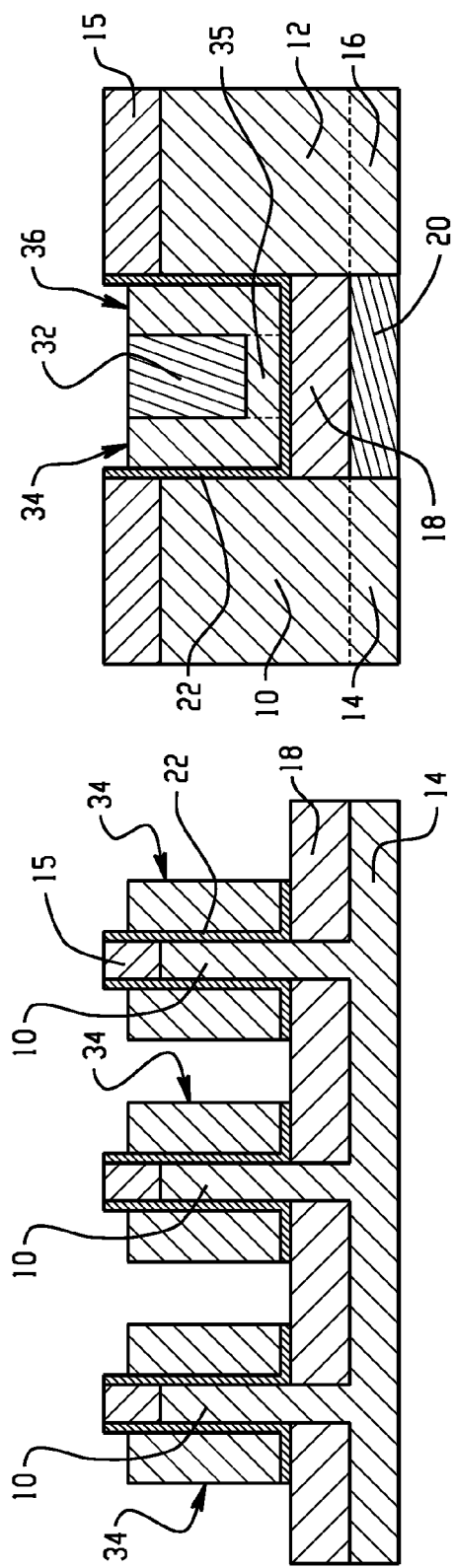
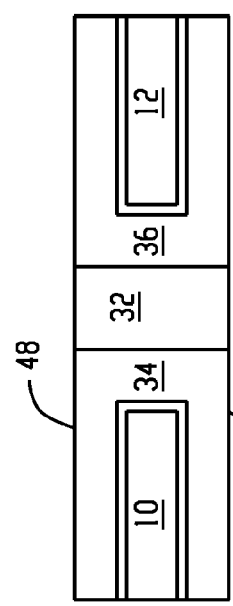
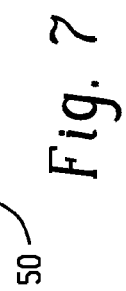
Fig. 6A
Fig. 6B
Fig. 7

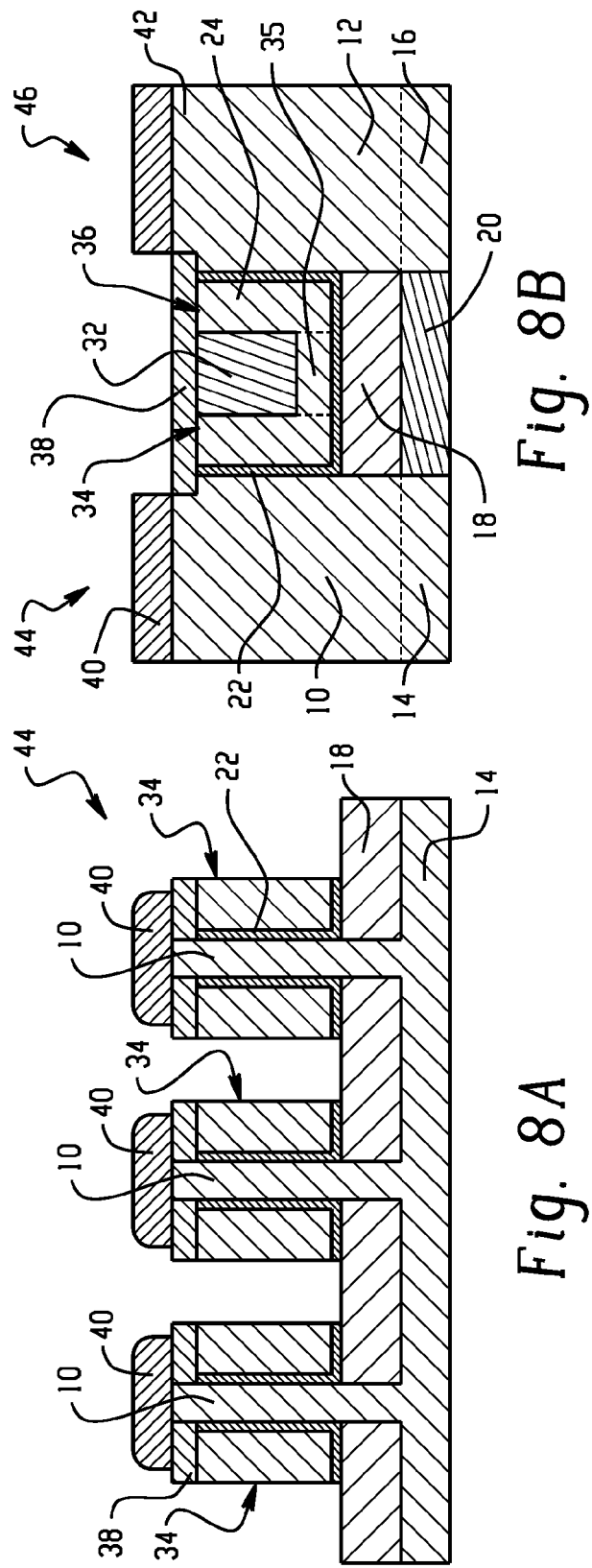

VERTICAL-TRANSPORT FIELD-EFFECT TRANSISTORS WITH A DAMASCENE GATE STRAP

BACKGROUND

The present invention relates to semiconductor device fabrication and integrated circuits and, more specifically, to methods for forming a structure that includes vertical-transport field-effect transistors and structures that include vertical-transport field-effect transistors.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation.

Planar field-effect transistors and fin-type field-effect transistors constitute a category of transistor structures in which the direction of gated current in the channel is in a horizontal direction parallel to the substrate surface. In a vertical-transport field-effect transistor, the source and the drain are arranged at the top and bottom of a semiconductor fin or pillar. The direction of the gated current transport in the channel between the source and drain is generally perpendicular (i.e., vertical) to the substrate surface and parallel to the height of the semiconductor fin or pillar.

The gate length of a vertical-transport field-effect transistor may be defined by depositing a thick layer of a gate material that covers the semiconductor fins and then recessing the gate material to a given height relative to the top surface of the semiconductor fins. The etch-back process used to recess the gate material can introduce variations in the gate length among the different vertical-transport field-effect transistors due to, among other factors, etch loading and variations in the grain size of the gate material.

SUMMARY

In an embodiment, a method includes forming a first semiconductor fin, forming a second semiconductor fin separated from the first semiconductor fin by a gap, and conformally depositing a gate stack that extends across the first semiconductor fin, the second semiconductor fin, and the gap. A section of the gate stack is located in the gap. The method further includes forming a gate strap layer in the first gap on the section of the gate stack, and patterning the gate stack to form a first gate electrode associated with the first semiconductor fin and a second gate electrode associated with the second semiconductor fin. The gate strap layer masks the section of the gate stack when the gate stack is patterned. The first gate electrode is connected with the second gate electrode by the gate strap layer and the section of the gate stack.

In an embodiment, a structure includes a first vertical-transport field-effect transistor having a first semiconductor fin and a first gate electrode associated with the first semiconductor fin, a second vertical-transport field-effect transistor having a second semiconductor fin and a second gate electrode associated with the first semiconductor fin, and a gate strap layer connecting the first gate electrode with the second gate electrode. The first gate electrode, the second gate electrode, and the gate strap layer have respective side surfaces that are coplanar.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1 is a schematic top view showing an arrangement of fins in a device structure at an initial fabrication stage of a processing method in accordance with embodiments of the invention.

FIG. 1A is a cross-sectional view taken generally along line 1A-1A in FIG. 1.

FIG. 1B is a cross-sectional view taken generally along line 1B-1B in FIG. 1.

FIGS. 2A and 2B are respective cross-sectional views of the device structure at a fabrication stage of the processing method subsequent to FIGS. 1A and 1B.

FIGS. 3A and 3B are respective cross-sectional views of the device structure at a fabrication stage of the processing method subsequent to FIGS. 2A and 2B.

FIGS. 4A and 4B are respective cross-sectional views of the device structure at a fabrication stage of the processing method subsequent to FIGS. 3A and 3B.

FIGS. 5A and 5B are respective cross-sectional views of the device structure at the fabrication stage of the processing method subsequent to FIGS. 4A and 4B.

FIGS. 6A and 6B are respective cross-sectional views of the device structure at the fabrication stage of the processing method subsequent to FIGS. 5A and 5B.

FIG. 7 is a top view of the device structure of FIG. 6B in which the hardmask sections are omitted from the fins for clarity of description.

FIGS. 8A and 8B are respective cross-sectional views of the device structure at the fabrication stage of the processing method subsequent to FIGS. 6A and 6B.

DETAILED DESCRIPTION

With reference to FIGS. 1, 1A, 1B and in accordance with embodiments of the invention, fins 10 project in a vertical direction from a bottom source/drain region 14 and fins 12 projects in a vertical direction from a bottom source/drain region 16. As used herein, the term "source/drain region" means a doped region of semiconductor material that can function as either a source or a drain of a field-effect transistor. A substrate (not shown) located beneath the bottom source/drain regions 14, 16 may be, for example, a bulk single-crystal silicon substrate.

The fins 10 and the fins 12 are three-dimensional bodies composed of a semiconductor material, such as undoped or intrinsic silicon, arranged in lengthwise parallel rows. Each of the fins 10 includes sidewalls 11a that project in a vertical direction relative to the top surface of the bottom source/drain region 14 and an end surface 11b that connects the vertical sidewalls 11a together. Each of the fins 12 includes sidewalls 13a that project in a vertical direction relative to the top surface of the bottom source/drain region 16 and an end surface 13b that connects the vertical sidewalls 13a together. The fins 10 may be arranged in an end-to-end arrangement with the fins 12 such that the end surfaces 11b face the end surfaces 13b.

The fins 10 and the fins 12 may be formed from an epitaxial layer of intrinsic semiconductor material, which is grown on the bottom source/drain regions 14, 16 and patterned using photolithography and etching processes, such as a sidewall imaging transfer (SIT) process or self-aligned double patterning (SADP). Each of the fins 10, 12 may be capped by a section of a hardmask 15 associated with their patterning.

The fins 10 and the bottom source/drain region 14 may be used to fabricate one or more n-type vertical-transport field-effect transistors. In connection with an n-type vertical field effect transistor, the bottom source/drain region 14 may be composed of silicon and include a concentration of an n-type dopant from Group V of the Periodic Table (e.g., phosphorus (P) and/or arsenic (As)) that is effective to impart n-type electrical conductivity to the constituent semiconductor material.

The fins 12 and the bottom source/drain region 16 may be used to fabricate one or more p-type vertical-transport field-effect transistors. In connection with a p-type vertical field effect transistor, the bottom source/drain region 16 may be composed of a silicon-germanium (SiGe) alloy and include a concentration of p-type dopant from Group III of the Periodic Table (e.g., boron (B), aluminum (Al), gallium (Ga), and/or indium (In)) in a concentration that is effective to impart p-type to the constituent semiconductor material.

A trench isolation region 20 is formed that electrically isolates the bottom source/drain region 14 from the bottom source/drain region 16. The trench isolation region 20 may be composed of a dielectric material, such as an oxide of silicon (e.g., silicon dioxide ($SiO_2$)).

With reference to FIGS. 2A, 2B in which like reference numerals refer to like features in FIGS. 1A, 1B and at a subsequent fabrication stage, a bottom spacer layer 18 is formed on the bottom source/drain regions 14, 16. The bottom spacer layer 18 may be composed of a dielectric material, such as silicon nitride ($Si_3N_4$) or silicon dioxide ($SiO_2$), that is deposited by a directional deposition technique, such as gas cluster ion beam (GCIB) deposition, and that is an electrical insulator. The fins 10, 12 penetrate in the vertical direction through the thickness of the bottom spacer layer 18 with only a fraction of their length (i.e., height) overlapped at their respective bases by the bottom spacer layer 18.

A gate dielectric layer 22 is conformally deposited on the fins 10, 12 and the bottom spacer layer 18. The gate dielectric layer 22 may be composed of a dielectric material, such as a high-k dielectric having a dielectric constant (e.g., permittivity) higher than the dielectric constant of $SiO_2$. In particular, candidate high-k dielectric materials for the gate dielectric layer 22 may have a dielectric constant (i.e., permittivity) greater than 10 and, in an embodiment, a dielectric constant in a range of 10 to 100. Candidate high-k dielectric materials for the gate dielectric layer 22 include, but are not limited to, a hafnium-based dielectric material like hafnium oxide ($HfO_2$), a layered stack of a hafnium-based dielectric material and another other dielectric material (e.g., aluminum oxide ($Al_2O_3$)), or combinations of these and other dielectric materials.

A gate stack 24 is formed that overlaps with the fins 10, 12. The gate stack 24 and fins 10, 12 may be used to form one or more fin-type field-effect transistors. The gate stack 24 may be composed of one or more conformal barrier metal layers and/or work function metal layers, such as titanium aluminum carbide (TiAlC), titanium nitride (TiN), and/or tungsten (W). The layers of gate stack 24 may be serially deposited by physical vapor deposition (PVD) or CVD on the fins 10, 12 and the bottom spacer layer 18. The gate stack 24 may include different layers in the device region associated with the bottom source/drain region 14 than the device region associated with the bottom source/drain region 16. The formation of the gate stack 24 as a conformal layer differs from conventional gate stacks that are deposited and planarized to be coplanar with the sections of the hardmask 15. A section of the gate stack 24 is positioned on the trench isolation region 20 that is located between the fins 10 and the fins 12.

Because the gate stack 24 is conformal and the thickness of the gate stack 24 is controlled to be less than half of the spacing between adjacent fins 10, 12, the gate stack 24 includes spaces or gaps 23, 25 that are unfilled and open. The gaps 23 are located between the vertical sidewalls 11a (FIGS. 1, 1A) of adjacent pairs of the fins 10 and between the vertical sidewalls 13a (FIG. 1) of adjacent pairs of the fins 12. The gaps 25 are located between the end surfaces 11b (FIGS. 1, 1B) of the fins 10 and the respective end surfaces 13b (FIGS. 1, 1B) of the fins 12 that have the end-to-end arrangement with the end surfaces 11b.

With reference to FIGS. 3A, 3B in which like reference numerals refer to like features in FIGS. 2A, 2B and at a subsequent fabrication stage, a sacrificial dielectric layer 26 is deposited and planarized with, for example, chemical mechanical polishing (CMP)) using, for example, the gate stack layer 24 as an etch-stop. The sacrificial dielectric layer 26 may be composed of a dielectric material, such as silicon dioxide ($SiO_2$), that is deposited by chemical vapor deposition (CVD). The sacrificial dielectric layer 26 fills the gaps 23 (FIG. 2A) in the gate stack 24 that appear between the fins 10 and also between the fins 12, as well as each gap 25 (FIG. 2A) in the gate stack 24 between fins 10 and fins 12. The sacrificial dielectric layer 26 fills the gaps 23, 25 (FIGS. 2A, 2B) in the gate stack 24 that appear between the fins 10, 12.

With reference to FIGS. 4A, 4B in which like reference numerals refer to like features in FIGS. 3A, 3B and at a subsequent fabrication stage, an etch mask 28 is applied that includes an opening 30 aligned with the portion of the sacrificial dielectric layer 26 that is located in each of the gaps 25 between the fins 10 and the fins 12. The etch mask 28 may include, for example, an anti-reflective coating deposited by CVD and a photoresist layer comprised of a photoresist material that is applied by a spin coating process, pre-baked, exposed to a radiation projected through a photomask, baked after exposure, and developed with a chemical developer to form the opening 30.

The opening 30 may be dimensioned such that the sacrificial dielectric layer 26 is removed only over an area that is located between the gate stack 24 on fin 10 and the gate stack 24 on fin 12. In one lateral dimension, the sacrificial dielectric layer 26 is removed in each gap 25 from between the end 11b of each fin 10 and the confronting end 13b of the fin 12. In the other lateral direction and at the edges of the ends 11b, 13b, each gap 25 is bounded on by sidewalls of the sacrificial dielectric layer 26 that are aligned with the gate stack 24 on the sidewalls 11a of fin 10 and the gate stack 24 on the sidewalls 13a of fin 12 aligned with the sidewalls 11a of fin 10.

The sacrificial dielectric layer 26 is removed over the area of the opening 30 with an etching process to reopen the gaps 25. The respective sections of the gate dielectric layer 22 and the gate stack 24 located in the gaps 25 are revealed when the gaps 25 are reopened. The material of the sacrificial dielectric layer 26 is selected such that the sacrificial dielectric layer 26 can be removed selective to the material(s) of the gate stack 24. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

With reference to FIGS. 5A, 5B in which like reference numerals refer to like features in FIGS. 4A, 4B and at a subsequent fabrication stage, a gate strap layer 32 is deposited and planarized in a damascene process to form respective sections that fill the gaps 25 opened by the removal of the portion of the sacrificial dielectric layer 26 from the gaps 25. The gate strap layer 32 may be composed of a conductor, such as cobalt (Co), titanium (Ti), titanium nitride (TiN), tungsten (W), or a combination of these metals deposited by CVD or atomic layer deposition (ALD). The gate strap layer 32 is planarized with, for example, CMP. The gap 25 provides a size constraint on the lateral dimensions of the section of the gate strap layer 32 that is formed in each gap 25.

With reference to FIGS. 6A, 6B, 7 in which like reference numerals refer to like features in FIGS. 5A, 5B and at a subsequent fabrication stage, the sacrificial dielectric layer 26 is removed by an etching process that removes the dielectric layer of the sacrificial dielectric layer 26 selective to the materials of the gate dielectric layer 22, the gate stack 24, and the gate strap layer 32. After removal of the sacrificial dielectric layer 26, the gate dielectric layer 22, the gate stack 24, and the gate strap layer 32 are recessed relative to the top surface of the hardmask 15 with one or more etching processes. The individual etching processes may be directional, such as reactive ion etching (ME), and may be based on respective etch chemistries that remove the conductor(s) of the gate stack 24, the conductor of the gate strap layer 32, and the dielectric material of the gate dielectric layer 22 selective to the material of the hardmask 15. The fins 10, 12 are protected against erosion by the hardmask 15 during the etching processes. The recessing of the gate stack 24 determines a gate length of the device structures being formed by the fabrication method.

The etching processes pattern the gate stack 24 into individual gate electrodes 34, 36 and remove the gate dielectric layer 22 from areas in the gaps 23 that are exposed by the removal of the gate stack 24. The etching processes completely remove the gate dielectric layer 22 and gate stack 24 from the gaps 23 (FIG. 2A) to provide self-aligned gate cuts. One of the gate electrodes 34 is associated with each of the fins 10 and wraps about the sidewalls 11a of the fin 10 over a channel region. One of the gate electrodes 36 is associated with each of the fins 12 and wraps about the sidewalls 13a of the fin 12 over a channel region.

The gate electrodes 34, 36 are formed in a manner similar to the formation of sidewall spacers in that the etching process removes the material of the gate dielectric layer 22 and conformal gate stack 24 from horizontal surfaces preferential to removal from vertical surfaces. In particular, the gate dielectric layer 22 and conformal gate stack 24 are removed from the bottom spacer layer 18 within the gaps 23. The gate electrodes 34, 36 are formed without the necessity of an additional etch mask. In conventional processes used to form gate electrodes for vertical-transport field-effect transistors, the gate stack has a thickness that is taller than the fins and is not conformal, which requires that a considerably greater thickness be removed during electrode patterning, and requires an etch mask that covers the gate stack at the intended locations for the gate electrodes during etching.

The respective section of the gate strap layer 32 in each gap 25 (FIG. 4B) operates as an etch mask for an underlying connecting section of the gate stack 24 during the removal of the sacrificial dielectric layer 26. When the gate electrodes 34, 36 are formed, a gate connector 35 is defined by this underlying connecting section of the gate stack 24. The gate strap layer 32 operates as a gate strap between at least one of the gate electrodes 34 and at least one of the gate electrodes 36 and, in conjunction with the gate connector 35, directly connects a pair of the gate electrodes 34, 36.

As best shown in FIG. 7, the gate electrode 34, the gate electrode 36, and the gate strap layer 32 may have respective side surfaces 48 that are coplanar in a vertical direction and respective side surfaces 50 that are coplanar in a vertical direction. The gate electrode 34 wraps about the fin 10, and the gate electrode 36 wraps about the fin 12 with the gate strap layer 32 arranged laterally between the gate electrode 34 and the gate electrode 36. The coplanar alignment of the side surfaces 48 and the coplanar alignment of the side surfaces 50 arise from the size constraint imposed on the lateral dimensions of each section of the gate strap layer 32 by the corresponding gap 25 when the gap strap layer 32 is formed as described hereinabove in connection with FIGS. 5A, 5B.

With reference to FIGS. 8A, 8B in which like reference numerals refer to like features in FIGS. 6A, 6B, 7 and at a subsequent fabrication stage, a top spacer layer 38 is formed on the top surfaces of the gate electrodes 34, 36. The top spacer layer 38 may be composed of a dielectric material, such as silicon nitride ($Si_3N_4$), that is deposited by CVD and then planarized by CMP. The fins 10, 12 penetrate in the vertical direction through the thickness of the top spacer layer 38 so that their top surfaces are exposed and accessible for subsequent processing.

Top source/drain regions 40 are formed on the top surfaces of the fins 10 that are exposed through the top spacer layer 38. The top source/drain regions 40 may be composed of semiconductor material that is doped to have the same conductivity type as the bottom source/drain region 14. If the bottom source/drain region 14 is n-type, then the top source/drain regions 40 may be sections of an epitaxial layer of semiconductor material formed by an epitaxial growth process with in-situ doping, and may include a concentration of an n-type dopant from Group V of the Periodic Table (e.g., phosphorus (P) and/or arsenic (As)) that is effective to impart n-type electrical conductivity to the constituent semiconductor material. In an embodiment, the top source/drain regions 40 may be formed by a selective epitaxial growth (SEG) process in which semiconductor material nucleates for epitaxial growth on semiconductor surfaces (e.g., fins 10), but does not nucleate for epitaxial growth from insulator surfaces (e.g., top spacer layer 38). The top surface of the fins 12 may be covered by a protect layer when the top source/drain regions 40 are formed.

Top source/drain regions 42 are formed on the top surfaces of the fins 12 that are exposed through the top spacer layer 38. The semiconductor material constituting the top source/drain regions 42 is doped to have the same conductivity type as the bottom source/drain region 16. For example, if the bottom source/drain region 16 is p-type, then the top source/drain regions 42 may be sections of an epitaxial layer of semiconductor material formed by an epitaxial growth process with in-situ doping, and may include a concentration of a p-type dopant from Group III of the Periodic Table (e.g., boron (B), aluminum (Al), gallium (Ga), and/or indium (In)) that is effective to impart p-type electrical conductivity to the constituent semiconductor material. In an embodiment, the top source/drain regions 42 may be formed by a selective epitaxial growth (SEG) process in which semiconductor material nucleates for epitaxial growth on semiconductor surfaces (e.g., fins 12), but does not nucleate for epitaxial growth from insulator surfaces (e.g., top spacer layer 38). The top surfaces of the fins 10 may be covered by a protect layer when the top source/drain regions 42 are formed.

The resulting device structure includes one or more n-type vertical-transport field-effect transistors 44 that include the fins 10, the bottom source/drain region 14, the top source/drain regions 40, and the gate electrode 34. Each gate electrode 34 is arranged along the height of its associated fin 10 in the vertical direction between the bottom source/drain region 14 and the top source/drain regions 40. During operation, a vertical channel region for vertical carrier transport is defined in a portion of each fin 10 overlapped by the gate electrode 34 in the vertical direction between the bottom source/drain region 14 and the top source/drain regions 40.

The resulting device structure includes one or more p-type vertical-transport field-effect transistors 46 that include the fins 12, the bottom source/drain region 16, the top source/drain regions 42, and the gate electrode 36. Each gate electrode 36 is arranged along the height of its associated fin 12 in the vertical direction between the bottom source/drain region 16 and the top source/drain regions 42. During operation, a vertical channel region for vertical carrier transport is defined in a portion of each fin 12 overlapped by the gate electrode 36 in the vertical direction between the bottom source/drain region 16 and the top source/drain regions 42.

Middle-of-line (MOL) and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the gate electrodes and source/drain regions of the vertical-transport field-effect transistors 44, 46.

The deposited thickness of the gate stack 24 may be reduced through the introduction of the gate strap layer 32 that operates as a gate strap between the gate electrode 34 of the n-type vertical-transport field-effect transistor 44 and the gate electrode 36 of the p-type vertical-transport field-effect transistor 46. The gate electrode 34 and the gate electrode 36 are shaped by etching the layers of the gate stack 24, and the gate strap represented by gate strap layer 32 is formed by a damascene process and is not shaped by etching a layer of its constituent material.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first semiconductor fin;
    forming a second semiconductor fin separated from the first semiconductor fin by a first gap;
    conformally depositing a gate stack that extends across the first semiconductor fin, the second semiconductor fin, and the first gap, wherein a first section of the gate stack is located in the first gap;
    forming a gate strap layer in the first gap on the first section of the gate stack; and
    patterning the gate stack to form a first gate electrode associated with the first semiconductor fin and a second gate electrode associated with the second semiconductor fin,
    wherein the gate strap layer masks the first section of the gate stack when the gate stack is patterned, and the first gate electrode is connected with the second gate electrode by the gate strap layer and the first section of the gate stack.

2. The method of claim 1 wherein the first semiconductor fin projects in a vertical direction from a first source/drain region of a first vertical-transport field-effect transistor, and further comprising:
    epitaxially growing a second source/drain region of the first vertical-transport field-effect transistor from the first semiconductor fin,
    wherein the first gate electrode is arranged in the vertical direction between the first source/drain region and the second source/drain region of the first vertical-transport field-effect transistor.

3. The method of claim 2 wherein the second semiconductor fin projects in the vertical direction from a first source/drain region of a second vertical-transport field-effect transistor, and further comprising:
    epitaxially growing a second source/drain region of the second vertical-transport field-effect transistor from the second semiconductor fin, wherein the second gate electrode is arranged in the vertical direction between the first source/drain region and the second source/drain region of the second vertical-transport field-effect transistor.

4. The method of claim 1 wherein the second semiconductor fin has a sidewall, the first gap is located between an end surface of the first semiconductor fin and an end surface of the second semiconductor fin, and further comprising:
forming a third semiconductor fin having a sidewall that is separated by a second gap from the sidewall of the second semiconductor fin; and
depositing a dielectric layer with a first section that fills the first gap and a second section that fills the second gap.

5. The method of claim 4 further comprising:
removing the first section of the dielectric layer from the first gap,
wherein the gate strap layer is formed in the first gap after the first section of the dielectric layer is removed from the first gap.

6. The method of claim 5 wherein the second section of the dielectric layer is masked by an etch mask when the first section of the dielectric layer is removed from the first gap.

7. The method of claim 5 wherein patterning the gate stack to form the first gate electrode associated with the first semiconductor fin and the second gate electrode associated with the second semiconductor fin comprises:
removing the second section of the dielectric layer from the second gap to expose a second section of the gate stack; and
removing the second section of the gate stack when the gate stack is patterned to form the first gate electrode and the second gate electrode.

8. The method of claim 7 wherein a third gate electrode associated with the third semiconductor fin is formed when the gate stack is patterned, and the second gap is located between the third gate electrode and the second gate electrode.

9. The method of claim 1 wherein the first section of the gate stack is positioned on a trench isolation region located between the first semiconductor fin and the second semiconductor fin.

10. The method of claim 1 wherein the first semiconductor fin and the first gate electrode comprise a first vertical-transport field-effect transistor, the first semiconductor fin projects in a vertical direction from a first source/drain region of the first vertical-transport field-effect transistor, and further comprising:
forming a second source/drain region of the first vertical-transport field-effect transistor,
wherein the first gate electrode is positioned in the vertical direction between the first source/drain region and the second source/drain region of the first vertical-transport field-effect transistor.

11. The method of claim 10 wherein the second semiconductor fin and the second gate electrode comprise a second vertical-transport field-effect transistor, the second semiconductor fin projects in the vertical direction from a first source/drain region of the second vertical-transport field-effect transistor, and further comprising:
forming a second source/drain region of the second vertical-transport field-effect transistor,
wherein the second gate electrode is positioned in the vertical direction between the first source/drain region and the second source/drain region of the second vertical-transport field-effect transistor.

12. The method of claim 11 wherein the first vertical-transport field-effect transistor is an n-type vertical-transport field-effect transistor in which the first source/drain region and the second source/drain region of the first vertical-transport field-effect transistor are comprised of an n-type semiconductor material, and the second vertical-transport field-effect transistor is a p-type vertical-transport field-effect transistor in which the first source/drain region and the second source/drain region of the second vertical-transport field-effect transistor are comprised of a p-type semiconductor material.

13. The method of claim 1 wherein the first section of the gate stack is located on a trench isolation region in the first gap, and a gate dielectric layer is formed on the first semiconductor fin, the second semiconductor fin, and the trench isolation before the gate stack is conformally deposited.

14. The method of claim 1 wherein forming the gate strap layer in the first gap on the first section of the gate stack comprises:
depositing a conductor layer that fills the first gap and that is located on the first semiconductor fin and the second semiconductor fin; and
planarizing the conductor layer to remove the conductor layer from the first semiconductor fin and the second semiconductor fin and to form the gate strap layer in the first gap.

15. The method of claim 1 wherein patterning the gate stack to form the first gate electrode associated with the first semiconductor fin and the second gate electrode associated with the second semiconductor fin comprises:
directionally etching the gate stack to form the first gate electrode and the second gate electrode,
wherein the gate stack is directionally etched without an etch mask located on the gate stack.

16. The method of claim 15 wherein the second semiconductor fin has a sidewall, the first gap is located between an end surface of the first semiconductor fin and an end surface of the second semiconductor fin, and further comprising:
forming a third semiconductor fin with a sidewall that is separated by a second gap from the sidewall of the second semiconductor fin; and
depositing a dielectric layer with a first section that fills the first gap and a second section that fills the second gap.

17. The method of claim 16 further comprising:
removing the first section of the dielectric layer from the first gap before the gate strap layer is formed; and
removing the second section of the dielectric layer from the second gap before the gate stack is directionally etched.

18. A structure comprising:
a first vertical-transport field-effect transistor including a first semiconductor fin and a first gate electrode associated with the first semiconductor fin;
a second vertical-transport field-effect transistor including a second semiconductor fin and a second gate electrode associated with the first semiconductor fin; and
a gate strap layer connecting the first gate electrode with the second gate electrode,
wherein the first gate electrode, the second gate electrode, and the gate strap layer have respective side surfaces that are coplanar.

19. The structure of claim 18 wherein the first semiconductor fin and the first gate electrode comprise an n-type vertical-transport field-effect transistor, and the second semiconductor fin and the second gate electrode comprise a p-type vertical-transport field-effect transistor.

20. The structure of claim 18 wherein the first gate electrode and the second gate electrode are directly connected by the gate strap layer.

* * * * *